(12) United States Patent
Endo et al.

(10) Patent No.: US 9,216,607 B2
(45) Date of Patent: Dec. 22, 2015

(54) SCREEN PRINTING PLATE FOR SOLAR CELL AND METHOD FOR PRINTING SOLAR CELL ELECTRODE

(75) Inventors: Yoko Endo, Annaka (JP); Ryo Mitta, Annaka (JP); Takenori Watabe, Annaka (JP); Hiroyuki Otsuka, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 13/980,902

(22) PCT Filed: Jan. 25, 2012

(86) PCT No.: PCT/JP2012/051488
§ 371 (c)(1),
(2), (4) Date: Jul. 22, 2013

(87) PCT Pub. No.: WO2012/105381
PCT Pub. Date: Aug. 9, 2012

(65) Prior Publication Data
US 2013/0291743 A1    Nov. 7, 2013

(30) Foreign Application Priority Data
Jan. 31, 2011 (JP) .................. 2011-017886

(51) Int. Cl.
*B41N 1/24* (2006.01)
*H01L 31/0224* (2006.01)
*H01L 31/068* (2012.01)
*H01L 31/18* (2006.01)

(52) U.S. Cl.
CPC ...... *B41N 1/24* (2013.01); *B41N 1/248* (2013.01); *H01L 31/022425* (2013.01); *H01L 31/068* (2013.01); *H01L 31/1804* (2013.01); *Y02E 10/547* (2013.01)

(58) Field of Classification Search
CPC .............. H01L 31/068; H01L 31/0684; H01L 31/1804; H01L 31/03529; Y02E 10/547; B41N 1/24; B41F 15/34; B41F 15/36; B41F 15/38
USPC ........... 101/114, 126, 127, 129; 136/255, 256
See application file for complete search history.

(56) References Cited

U.S. PATENT DOCUMENTS

| 7,930,974 B2 * | 4/2011 | Nakatani et al. ............... 101/126 |
| 2007/0045594 A1 * | 3/2007 | Taira ............................. 252/500 |

(Continued)

FOREIGN PATENT DOCUMENTS

| JP | 2005-101426 A | 4/2005 | |
| JP | 2005-116559 | * 4/2005 | ............ H01L 31/104 |
| JP | 2005-116559 A | 4/2005 | |
| JP | 2006-54374 A | 2/2006 | |
| JP | 2009-16713 A | 1/2009 | |
| JP | 2009-272405 A | 11/2009 | |
| JP | 2010-027778 | * 4/2010 | ............ H01L 31/04 |
| WO | 2005/109524 A1 | 11/2005 | |

OTHER PUBLICATIONS

International Search Report dated Mar. 6, 2012, issued in corresponding application No. PCT/JP2012/051488.

*Primary Examiner* — Blake A Tankersley
*Assistant Examiner* — Marissa Ferguson Samreth
(74) *Attorney, Agent, or Firm* — Westerman, Hattori, Daniels & Adrian, LLP (57) ABSTRACT

The present invention relates to screen printing plate for a solar cell in which an electroconductive paste is used to simultaneously print a bus bar electrode and a finger electrode, the screen printing plate characterized in that the opening width of a finger electrode opening of the screen printing plate is less than 80 μm and a bus bar electrode opening of the screen printing plate has a closed section. The use of this screen printing plate makes it possible to reduce the cost of manufacturing solar cells, prevent the connecting section between the bus bar electrode and the finger electrode from breaking without causing an increase in shadow loss or compromising the aesthetic quality of the solar cells, and manufacture highly reliable solar cells with good productivity.

10 Claims, 5 Drawing Sheets

(56) References Cited

U.S. PATENT DOCUMENTS

| | | |
|---|---|---|
| 2007/0209697 A1 | 9/2007 | Karakida et al. |
| 2009/0285979 A1 | 11/2009 | Karakida et al. |
| 2011/0272022 A1* | 11/2011 | Dan et al. ............... 136/256 |
| 2011/0277831 A1* | 11/2011 | Yoshida et al. ......... 136/256 |
| 2014/0124027 A1* | 5/2014 | Teshima et al. ......... 136/256 |

* cited by examiner

FIG.1

PRIOR ART

FIG.2

PRIOR ART

FIG.3

PRIOR ART

FIG.4

PRIOR ART

FIG.5

PRIOR ART

FIG.6

PRIOR ART

FIG.7

PRIOR ART

FIG.8

PRIOR ART

FIG.9

PRIOR ART

FIG.10

PRIOR ART

SCREEN PRINTING PLATE FOR SOLAR CELL AND METHOD FOR PRINTING SOLAR CELL ELECTRODE

TECHNICAL FIELD

This invention relates to a screen printing plate which enables manufacture of solar cells with long-term reliability at good productivity. More particularly, it relates to a screen printing plate whose bus bar electrode mask pattern is modified such that electrodes may be formed at low cost while maintaining high conversion efficiency; and a method of printing solar cell electrodes using the screen printing plate.

BACKGROUND ART

Figure 1:
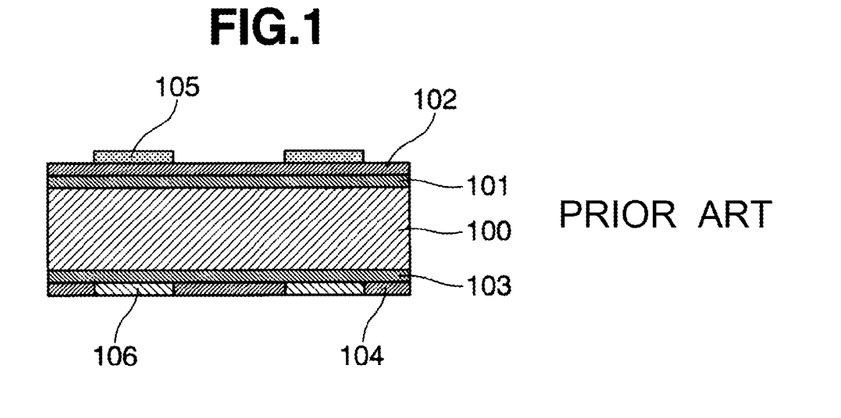
FIG. 1 is a cross-sectional view of electrodes of a typical solar cell.
Figure 2:
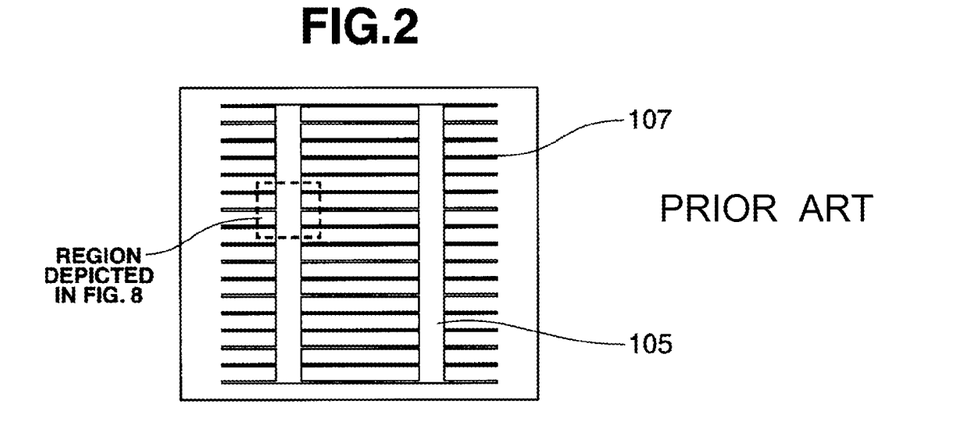
FIG. 2 is a plan view showing the front surface configuration of a typical solar cell.
Figure 3:
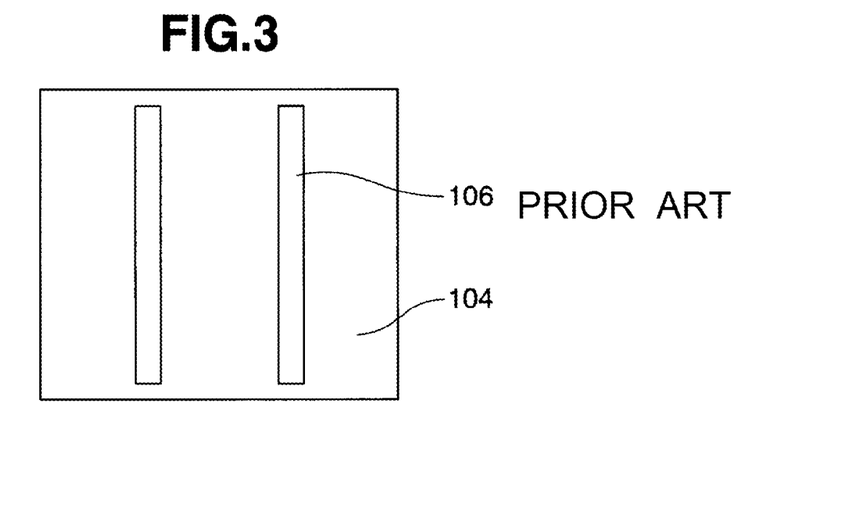
FIG. 3 is a plan view showing the back surface configuration of a typical solar cell.

A solar cell manufactured by the prior art technology is described with reference to its cross-sectional view (FIG. 1), front surface configuration (FIG. 2), and back surface configuration (FIG. 3). In general, the solar cell includes a p-type semiconductor substrate 100 of silicon or the like in which an n-type dopant is diffused to form an n-type diffusion layer 101 to define a p-n junction. On the n-type diffusion layer 101, an antireflection film 102 such as SiNx film is formed. On the back surface of p-type semiconductor substrate 100, an aluminum paste is coated over substantially the entire surface and fired to form a back surface field (BSF) layer 103 and an aluminum electrode 104. Also on the back surface, a broad electrode 106, known as bus bar electrode, is formed for current collection by coating a conductive paste containing silver or the like and firing. On the light-receiving surface side, finger electrodes 107 for current collection and broad electrodes 105, known as bus bar electrodes, for collecting current from the finger electrodes are arranged in a comb-shaped pattern so as to cross at substantially right angles.

In the manufacture of solar cells of this type, electrodes may be formed by various methods including evaporation, plating, printing and the like. The front finger electrodes 107 are generally formed by the printing/firing method to be described below because of ease of formation and low cost. Specifically, a conductive paste obtained by mixing silver powder, glass frit, organic vehicle, and organic solvent as main ingredients is generally used as the front electrode material. The conductive paste is coated by screen printing process or the like, and fired at high temperature in a firing furnace to form the front electrode.

The screen printing process is described below.

Figure 4:
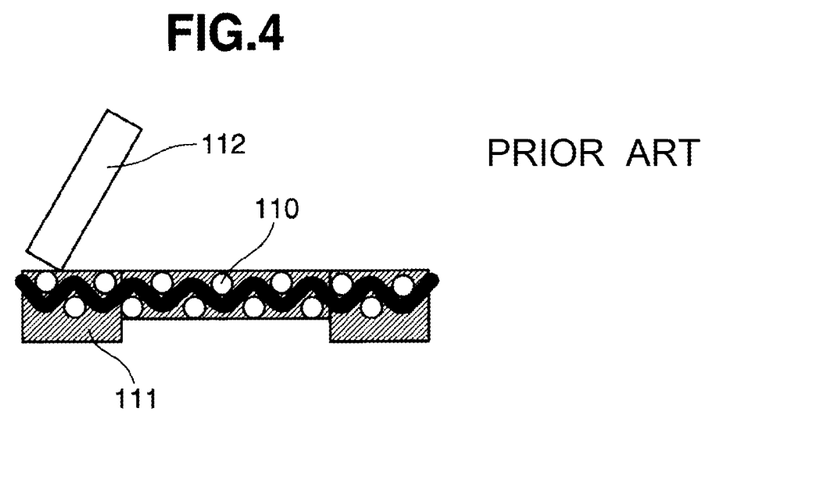
FIG. 4 schematically illustrates a printing step using a conventional screen printing plate.

The screen printing process uses a screen printing plate which is prepared by providing a mesh fabric 110 of orthogonally woven warp and weft filaments, coating the fabric with a photosensitive emulsion 111, exposure, and removing parts of the emulsion to define a substantially rectangular pattern hole (FIG. 4). The screen printing plate is placed over the work to be printed. A print paste (ink) is rested on the screen printing plate and spread over the pattern. A flexible blade known as printing squeegee 112 is traversed at a suitable squeegee hardness (60 to 80 degrees), squeegee angle (60 to 80 degrees), pressure or applied pressure (0.2 to 0.5 MPa), and printing speed (20 to 100 mm/sec) for thereby transferring the print paste to the work to be printed through the pattern hole. The print paste applied to the work to be printed is then dried to form a printed pattern.

Immediately after the print paste falls down through meshes in the pattern hole where filaments are absent and attaches to the work to be printed, the print paste remains unattached to portions corresponding to warp and weft filaments in the pattern hole. Later, the print paste attached to the portions corresponding to meshes starts flowing, resulting in a continuous printed pattern of uniform thickness.

As described above, the screen printing process is such that the print paste filled in the pattern hole on the screen printing plate is transferred to the work to be printed by traversing movement of the printing squeegee (or blade) whereby the same pattern as the pattern hole defined on the screen printing plate is formed on the work to be printed.

The contact resistance between the front finger electrode 107 formed by the above process and the silicon substrate 100 and the interconnect resistance of the electrode largely affect the conversion efficiency of a solar cell. To gain a high efficiency (low cell series resistance, high fill factor (FF)), the contact resistance and the interconnect resistance of the front finger electrode 107 must have fully low values.

Also, the electrode area must be small so that the light-receiving surface may take in as much light as possible. To improve short-circuit current (Jsc) while maintaining the FF, the finger electrode must be formed such that it may have a reduced width (thin) and an increased cross-sectional area, that is, a high aspect ratio.

While various methods are used to form solar cell electrodes, known methods of forming ultra-fine lines having a high aspect ratio include a method of forming grooves in a cell and filling the grooves with paste (JP-A 2006-54374) and a printing method based on inkjet printing. However, the former method is undesirable because the step of forming grooves in a substrate can cause damage to the substrate. Since the latter, inkjet printing method is designed to apply pressure to liquid to inject droplets through a thin nozzle, it is suitable to form fine lines, but difficult to gain a height.

On the other hand, the screen printing method is a low-cost, high-productivity method because formation of a printed pattern is easy, damaging of the substrate is minimized by adjusting the applied pressure, and the working rate per cell is high. If a conductive paste having high thixotropy is used, an electrode retaining the shape as transferred and having a high aspect ratio can be formed.

As discussed above, the screen printing method is more suitable to form high-aspect-ratio electrodes at low cost, than other printing methods.

However, when fine lines are printed using the above method, there arise a problem that the connection between bus bar electrode and finger electrode becomes very thin and at the worst, broken. If the finger electrode on the light-receiving side is locally thinned or even broken, that portion becomes a controlling factor of resistance, resulting in a drop of fill factor.

The cause of breakage is a difference in film thickness at the connection between bus bar electrode and finger electrode. In screen printing, the buildup of paste is in proportion to the size of an opening. Namely, a large buildup of paste is given for the bus bar electrode corresponding to a large opening whereas a small buildup of paste is given for the finger electrode corresponding to a small opening. Thus a difference arises in film thickness between the bus bar electrode and the finger electrode. If the electrodes are fired in this state, breakage occurs at the boundary between bus bar electrode and finger electrode because the bus bar electrode with a larger buildup undergoes a more shrinkage. If the difference is small, there arises a phenomenon that the connection between bus bar electrode and finger electrode becomes very thin.

Figure 8:
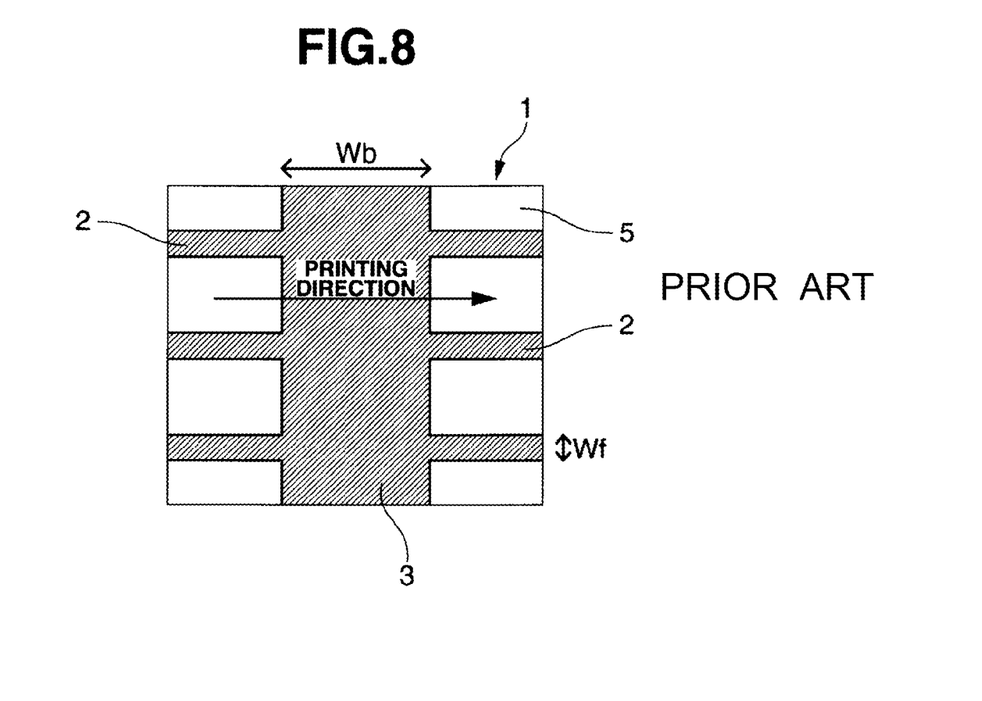
FIG. 8 is an enlarged view of openings in a conventional screen printing plate.
Figure 9:
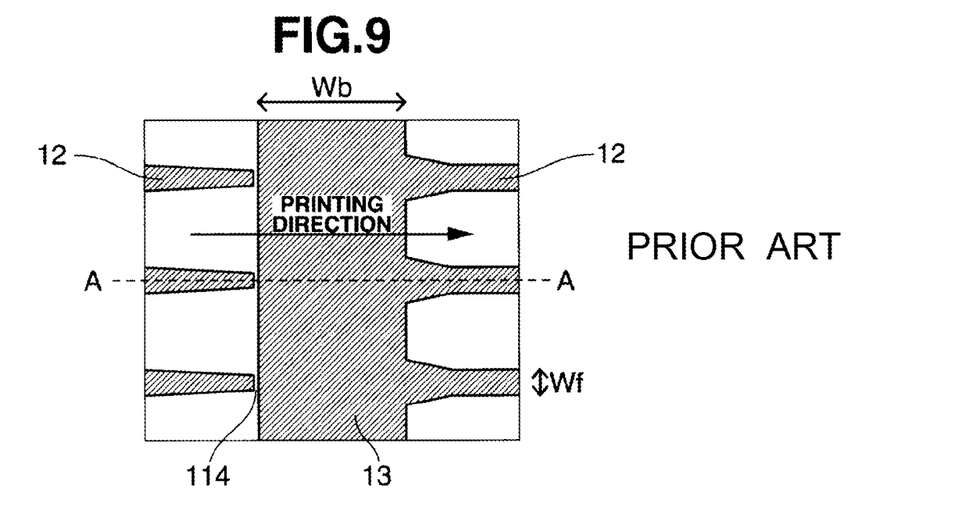
FIG. 9 is an enlarged view of electrodes printed using the conventional screen printing plate.

Further, in the screen printing process, the printing direction (traversing direction of a printing squeegee) also becomes a factor of promoting breakage. For preventing breakage of a finger electrode, the screen printing plate 1 is generally patterned such that the printing direction and the finger electrode opening 2 are substantially parallel, and the printing direction and the bus bar electrode opening 3 are substantially perpendicular (FIG. 8). With this design, the electrodes as printed are configured such that the width of the connection between bus bar electrode 13 and finger electrode 12 positioned on the upstream printing side with respect to finger electrode 12 is very narrow (FIG. 9). Such narrowing is outstanding particularly when fine lines are printed. This is because at the connection between finger electrode opening 2 and bus bar electrode opening 3, the printing squeegee falls in bus bar electrode opening 3, resulting in a less buildup of paste at this connection. In contrast, the width of the connection between bus bar electrode 13 and finger electrode 12 positioned on the downstream printing side tends to be broad because of a more buildup of paste (FIG. 9). Notably the plate includes blocked or masked zones 5.

Figure 5:
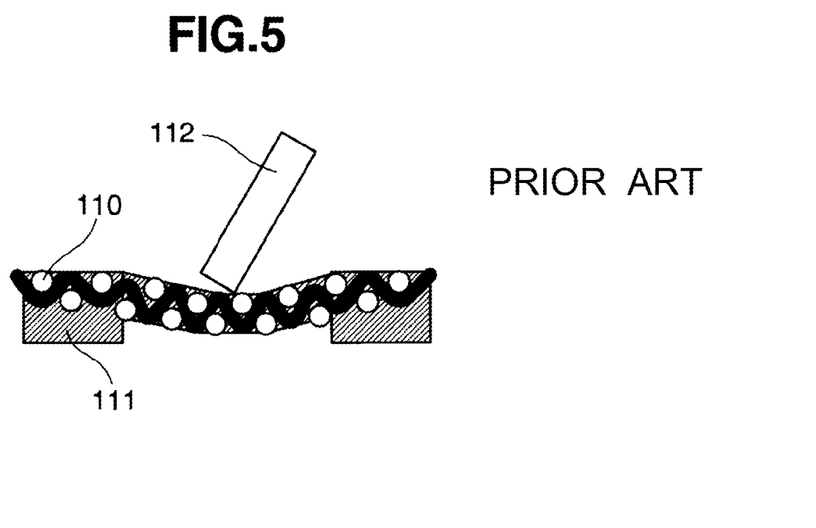
FIG. 5 schematically illustrates a saddle phenomenon during the printing step using a conventional screen printing plate.
Figure 6:
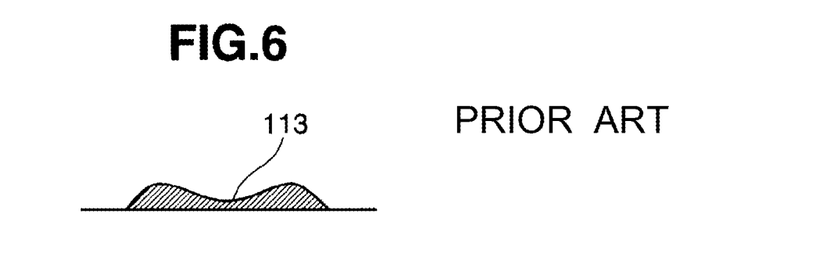
FIG. 6 is a cross-sectional view showing the profile of an electrode as printed using the conventional screen printing plate.
Figure 10:
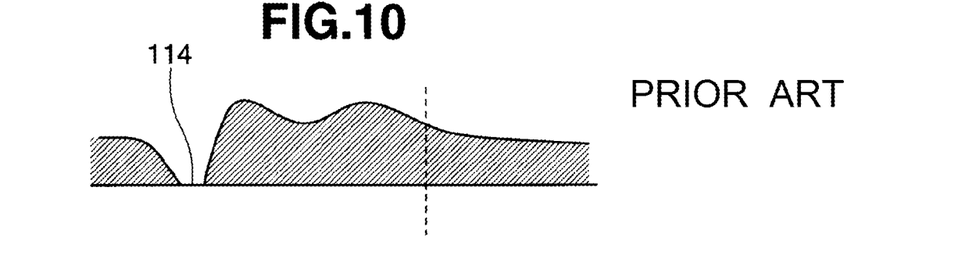
FIG. 10 is a cross-sectional view of the connections between bus bar electrode and finger electrode taken along line A-A in FIG. 9.

In addition, a saddle phenomenon is likely to occur since the bus bar electrode opening 3 is considerably wider than the finger electrode opening 2 and the squeegee 112 traverses across the plate perpendicular to the bus bar electrode opening 3 as mentioned above. The saddle phenomenon is that when a wide open portion like bus bar is printed, the open portion is pressed by the squeegee 112 (FIG. 5), and a central portion 113 is dented deeper than edges of paste in the width direction of bus bar electrode (FIG. 6). Occurrence of a saddle phenomenon brings a difference between the height of bus bar electrode at its edge in its width direction and the height of finger electrode. Since the bus bar electrode edge with a more buildup has a higher shrinkage factor during electrode firing, the connection between bus bar electrode 13 and finger electrode 12 can be broken 114 (FIG. 10). It is noted that in FIG. 10, the broken line denotes the connection between bus bar electrode 13 and finger electrode 12.

Even when a finger electrode and a bus bar electrode are separately printed, a saddle phenomenon occurs at the bus bar electrode, failing to prevent breakage at the connection between bus bar electrode and finger electrode.

To solve the above problem, JP-A 2009-272405 discloses broadening of the connection between bus bar electrode and finger electrode. On use of this method, however, blurs or clumps form because the connection between bus bar electrode and finger electrode is extremely thick. This gives rise to problems like an increased shadow loss and deteriorated properties. Since the solar cell is, as a matter of course, a device which is used under sunlight, there are many chances to public view, unlike other semiconductor devices. Accordingly, not only the performance, but also the appearance is very important for the solar cell. The method of the above patent has the problem that since the connection between bus bar electrode and finger electrode is thick, the finger electrode becomes discontinuous in width, detracting from the aesthetic appearance.

Figure 7:
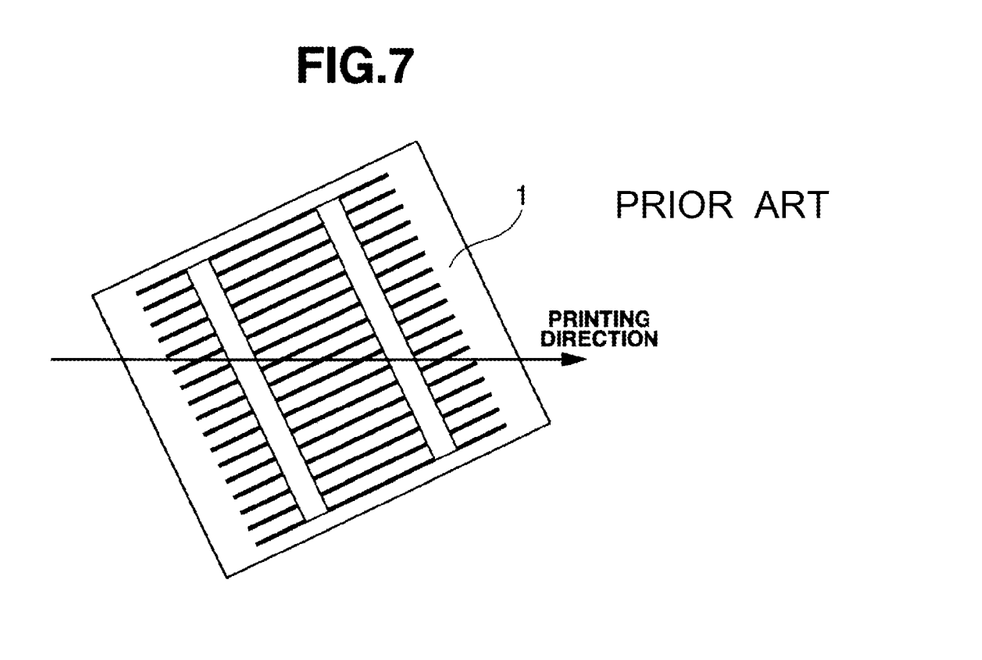
FIG. 7 schematically illustrates one exemplary method of avoiding breakage using a conventional screen printing plate.

It is also known to prevent the squeegee from falling in the bus bar opening by performing screen printing with the installation position of the screen printing plate rotated to an angle other than multiples of 90° relative to the squeegee travel direction (FIG. 7). This method, however, has the problem that since the squeegee travel direction is not parallel to the finger opening, the finger electrode is blurred, failing in precise printing.

SUMMARY OF INVENTION

Technical Problem

While the invention is made to overcome the above problems, its object is to provide a screen printing plate for use with solar cells and a method of printing solar cell electrodes through the screen printing plate, by which electrodes having a high aspect ratio and low resistance are formed for enabling low-cost manufacture of solar cells with high conversion efficiency.

Solution to Problem

The present invention aims to solve the above problems and pertains to a method of manufacturing a solar cell by printing a conductive paste to simultaneously form a bus bar electrode and a finger electrode. With respect to electrode formation by screen printing through a screen printing plate including a bus bar electrode opening, it has been found that if the bus bar electrode opening is partially provided with a blocked zone, the pressure applied by the squeegee to the paste filled in the opening is reduced. Then electrode breakage is inhibited. The invention is predicated on this finding.

Accordingly, the invention provides a screen printing plate for use with solar cells and a method of printing solar cell electrodes as defined below.

[1] A screen printing plate for use in printing a conductive paste to simultaneously form a bus bar electrode and a finger electrode on a solar cell, characterized in that the screen printing plate includes a finger electrode opening having an opening width of less than 80 μm and a bus bar electrode opening including a blocked zone.

[2] The screen printing plate of [1] wherein the blocked zone accounts for up to 60% of a bus bar area computed from the contour of the bus bar electrode opening of the screen printing plate.

[3] The screen printing plate of [1] or [2] wherein the blocked zone in the bus bar electrode opening is spaced apart a distance of 50 to 700 μm from the boundary between the finger electrode opening and the bus bar electrode opening.

[4] A method of printing solar cell electrodes, characterized in that a conductive paste is printed while using the screen printing plate of any one of [1] to [3] and moving a squeegee in a direction perpendicular to a longitudinal direction of the bus bar electrode.

It is noted that breakage rarely occurs with a commonly used finger opening having a width of 80 to 100 μm. The invention is effective for fine lines corresponding to a finger opening width of less than 80 μm.

In order to take full advantage of the invention when solar cell electrodes are printed using the screen printing plate having the features described above, it is desired that the printing direction be substantially perpendicular to the longitudinal direction of bus bar electrode.

Advantageous Effects of Invention

The use of the inventive screen printing plate makes it possible to reduce the cost of manufacturing solar cells, to prevent the connection between the bus bar electrode and the finger electrode from breaking without increasing the shadow loss or compromising the aesthetic appearance of solar cells, and to manufacture reliable solar cells at high productivity.

DESCRIPTION OF EMBODIMENTS

One embodiment of the invention is described below in detail. The screen printing plate for use in the manufacture of solar cells includes a bus bar electrode-providing portion including a blocked zone. In a preferred embodiment, the blocked zone accounts for up to 60%, more preferably up to 55% of an opening area computed from the contour of the bus bar electrode. The invention exerts its effect more when the blocked zone accounts for at least 30%, more preferably at least 45% of the opening area. The screen printing plate also includes a finger electrode opening having a width of less than 80 µm, preferably 40 µm to less than 80 µm, more preferably 40 to 75 µm, even more preferably 45 to 70 µm, and most preferably 50 to 60 µm.

Figure 11:
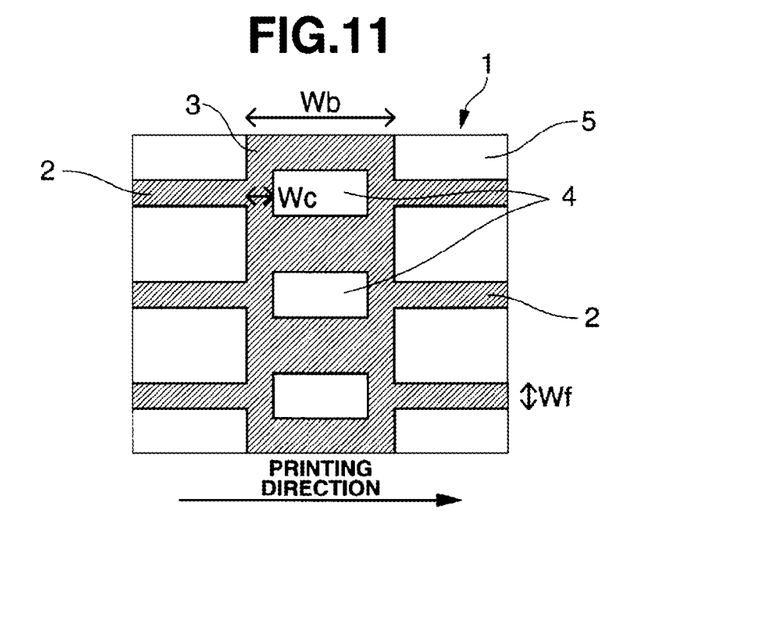
FIG. 11 is an enlarged view showing openings on a screen printing plate in one embodiment of the invention.

FIG. 11 illustrates an exemplary screen printing plate of the invention. In FIG. 11, the screen printing plate 1 includes a plurality of finger electrode openings 2 extending parallel to the printing direction (shown by arrow) and a bus bar electrode opening 3 of a broad width (Wb) extending perpendicular to the printing direction. The width Wb is preferably 0.5 to 3 mm, more preferably 1 to 2 mm. In the screen printing plate 1 according to the invention, the bus bar electrode opening 3 includes a plurality of blocked zones 4 arranged therein. These blocked zones 4 are formed at positions aligned with the longitudinal direction of the finger electrode openings 2. The blocked zone 4 within the bus bar electrode opening 2 is preferably spaced apart a distance (Wc) of 50 to 700 µm, more preferably 100 to 300 µm from the boundary between finger electrode opening 2 and bus bar electrode opening 3. If the distance is less than 50 µm, then the amount of paste discharged may be reduced, inviting breakage. If the distance exceeds 700 µm, then the push-out of paste by pressing of the squeegee becomes outstanding for a saddle phenomenon to occur, leaving a risk of breakage due to differential shrinkage upon firing. The spacing between blocked zones 4 is preferably 100 to 2,000 µm, more preferably 300 to 1,000 µm.

The total area of blocked zones 4 is up to 60% of the overall area of the bus bar electrode opening 3 and blocked zones 4 (that is, bus bar area computed from the contour of bus bar electrode opening 3 of the screen printing plate). The width Wf of the finger electrode opening 2 is less than 80 µm.

Figure 12:
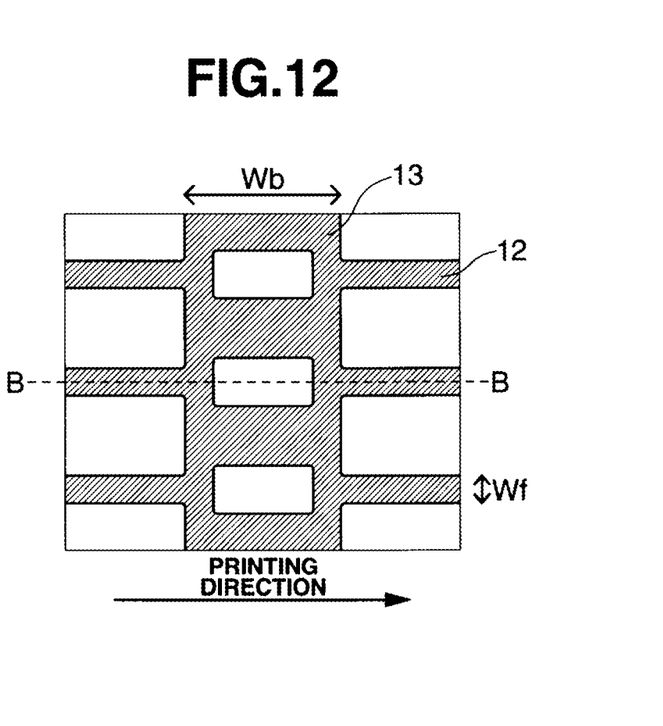
FIG. 12 is an enlarged view of electrodes printed using the screen printing plate in one embodiment of the invention.
Figure 13:
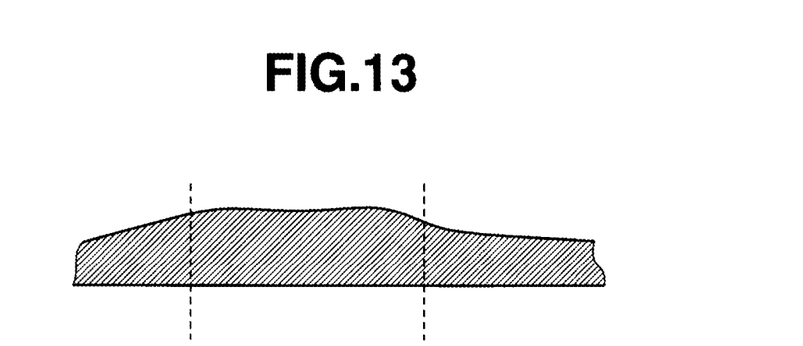
FIG. 13 is a cross-sectional view of the connections between bus bar electrode and finger electrode taken along line B-B in FIG. 12.

Use of the screen printing plate configured as above is effective for preventing breakage of the finger electrodes, fall-down of the squeegee in the bus bar electrode opening during printing, and a thickening of the finger electrode at transition from the bus bar electrode to the finger electrode, as best shown in FIGS. 12 and 13.

Now, one exemplary method of fabricating a solar cell using the screen printing plate according to the invention is described. The invention is not limited to the solar cell fabricated by this method.

An as-cut monocrystalline {100} p-type silicon substrate in which high purity silicon is doped with a Group III element such as boron or gallium so as to give a resistivity of 0.1 to 5 Ω·cm is etched with a conc. alkali solution of sodium hydroxide or potassium hydroxide having a concentration of 5 to 60% by weight or mixed acid of hydrofluoric acid and nitric acid for removing the work damaged surface layer. The monocrystalline silicon substrate may have been prepared by either the CZ or FZ method.

Subsequently, the substrate surface is provided with microscopic asperities known as texture. The texture is an effective means for lowering the reflectivity of solar cells. The texture may be readily provided by immersing the substrate in a hot alkaline solution of sodium hydroxide, potassium hydroxide, potassium carbonate, sodium carbonate or sodium hydrogencarbonate (concentration 1 to 10 wt %) at a temperature of 60 to 100° C. for about 10 to about 30 minutes. Often, a proper amount of 2-propanol is dissolved in the alkaline solution to promote the reaction.

The texturing is followed by washing with an aqueous acidic solution such as hydrochloric acid, sulfuric acid, nitric acid or hydrofluoric acid or a mixture thereof. Washing with hydrochloric acid is preferred from the cost and efficiency standpoints. To enhance cleanness, washing may be carried out by mixing 0.5 to 5 wt % of aqueous hydrogen peroxide with aqueous hydrochloric acid and heating at 60 to 90° C.

On the substrate, an emitter layer is formed by vapor phase diffusion using phosphorus oxychloride. In common silicon solar cells, a p-n junction must be formed only on the light-receiving surface. To this end, suitable means must be taken for avoiding any p-n junction on the back surface, for example, by carrying out diffusion while two substrates are mated together, or by forming a $SiO_2$ or $SiN_x$ film on the back surface as diffusion mask prior to diffusion. At the end of diffusion, the glass formed on the surface is removed using hydrofluoric acid or the like.

Next, an antireflection film is formed on the light-receiving surface. Using a plasma-enhanced chemical vapor deposition (CVD) system for film formation, a $SiN_x$ film is deposited to a thickness of about 100 nm. Often a mixture of monosilane ($SiH_4$) and ammonia ($NH_3$) is used as the reactant gas although nitrogen may be used instead of $NH_3$. Also hydrogen may be mixed with the reactant gas to adjust the process pressure, to dilute the reactant gas, or to enhance the bulk passivation effect when the substrate used is of polycrystalline silicon.

Next, a back electrode is formed by the screen printing method. On the back surface of the substrate, a paste obtained by mixing silver powder and glass frit with an organic binder is screen printed in a bus bar pattern, after which a paste obtained by mixing aluminum powder with an organic binder is screen printed in the region excluding the bus bar. After printing, the pastes are fired at a temperature of 700 to 800° C. for 5 to 30 minutes to form a back electrode. The back electrode is preferably formed by the printing method, although it can be formed by evaporation, sputtering or the like.

Next, a front electrode is formed by the screen printing method using the screen printing plate according to the invention.

Specifically, a paste obtained by mixing silver powder and glass frit with an organic binder is printed onto the front surface of the substrate using a screen printing plate having a comb-shaped printing pattern designed to a finger electrode width of 30 to 80 μm and a finger electrode spacing of 0.5 to 4.0 mm.

The screen printing plate of the invention may be obtained simply by providing the bus bar electrode opening with blocked zones as shown in FIG. 11, without a need to change the conventional solar cell pattern as mentioned above.

Commonly used screen printing plates include finger openings having a width of 80 to 100 μm. In this case, breakage as mentioned above rarely occurs because the finger electrodes are fully wide and can be printed thick. However, as lines are narrowed to a finger opening width of less than 80 μm, the difference in film thickness between bus bar electrode and finger electrode becomes greater. Then breakage can occur due to differential thermal shrinkage (FIG. 9).

In contrast, when a solar cell is manufactured by printing a bus bar electrode and a finger electrode simultaneously, the risk of breakage is avoidable by the printing step using a screen printing plate including a bus bar electrode opening including blocked zones accounting for up to 60% of the opening area computed from the contour of the bus bar electrode (FIG. 13).

In order to take full advantage of the invention when solar cells are manufactured by printing electrodes through the screen printing plate having the features described above, it is desired that the printing direction be substantially perpendicular to the bus bar electrode.

The use of the screen printing plate according to the invention has the additional effect of suppressing the finger electrode from thickening because the presence of blocked zones in the bus bar electrode opening reduces the amount of paste discharged at the last printing side (FIG. 12).

When a blocked zone is partially included in the bus bar opening, an unprinted area may be left after the printing. However, this causes no problems to the outer appearance because a solder-coated copper lead is bonded to the area upon fabrication of a module. As long as the area of bus bar electrode is at least 40% of the standard bus bar electrode area, the bond strength of the lead to the bus bar electrode is maintained. Since the amount of bus bar electrode used is reduced, solar cells can be manufactured at lower cost. The inclusion of blocked zones in the bus bar electrode opening of the screen printing plate avoids any breakage of the connection between bus bar electrode and finger electrode.

Once electrodes are formed by the above-mentioned method, they are fired by heating in air at a temperature of 700 to 800° C. for 5 to 30 minutes. Firing of the back electrode and light-receiving side electrode may be performed at a time.

EXAMPLES

Examples and Comparative Examples are given below by way of illustration and not by way of limitation.

Examples and Comparative Examples

To demonstrate the benefits of the invention, solar cells were manufactured by processing thirty (30) semiconductor substrates as follows.

There were provided screen printing plates bearing a conventional pattern A having a finger electrode opening width (Wf) of 60 μm (Comparative Example, FIG. 8), a pattern B including a bus bar electrode opening including blocked zones (FIG. 11), otherwise equivalent to pattern A, and a pattern C having a finger electrode opening width (Wf) of 100 μm (Comparative Example, FIG. 8) as the printing pattern. All the patterns commonly had a bus bar electrode opening width (Wb) of 1.5 mm.

More particularly, in pattern B, the bus bar electrode opening was spaced apart a distance We of 100 μm from the boundary between the finger electrode opening and the bus bar electrode opening, the spacing between blocked zones was 1,000 μm, and the total area of blocked zones was 55% of the bus bar area computed from the contour of the bus bar electrode opening.

There was provided an as-cut boron-doped {100} p-type silicon substrate 100 of 15 cm square having a thickness of 250 μm and a resistivity of 2.0 Ω·cm. The substrate was immersed in a conc. potassium hydroxide aqueous solution to remove the work damaged layer, textured, heat treated at 850° C. in a phosphorus oxychloride atmosphere to form an emitter layer 101, and etched with hydrofluoric acid to remove phosphorus glass, followed by washing and drying. Thereafter, a SiNx film 102 was formed using a plasma-enhanced CVD system. On the back surface, a paste of silver powder, glass frit and organic binder was screen printed in a bus bar pattern 106, after which a paste of aluminum powder and organic binder was screen printed in a pattern 104 excluding the bus bar. The organic solvent was evaporated off, yielding a semiconductor substrate having a back electrode formed thereon.

Next, a conductive paste based on silver powder, glass frit, organic vehicle and organic solvent and further containing a metal oxide as additive was applied onto the antireflection film on the semiconductor substrate by using a screen printing plate having the selected printing pattern at a squeegee hardness of 70 degrees, a squeegee angle of 70 degrees, an applied pressure of 0.3 MPa, and a printing speed of 50 mm/sec. After printing, the substrate was heated in a clean oven at 150° C. for drying and fired in air at 800° C.

Thirty (30) solar cells thus manufactured were observed for electrodes under an optical microscope and evaluated by a solar simulator (25° C. atmosphere, irradiation intensity 1 kW/m$^2$, spectrum AM 1.5 Global). Also under the optical microscope, the width of finger electrodes after printing and the width of connection were observed to inspect any breakage. The results on average of Example and Comparative Examples are shown in Table 1.

TABLE 1

| Level | | Finger opening (μm) | Bus bar opening (mm) | Blocked zones | Breakage | Short-circuit current (mA/cm$^2$) | Fill factor (%) | Conversion efficiency (%) |
|---|---|---|---|---|---|---|---|---|
| A | (Comparative Example) | 60 | 1.5 | absent | found | 35.1 | 73.6 | 15.50 |

TABLE 1-continued

| Level | | Finger opening (μm) | Bus bar opening (mm) | Blocked zones | Breakage | Short-circuit current (mA/cm$^2$) | Fill factor (%) | Conversion efficiency (%) |
|---|---|---|---|---|---|---|---|---|
| B | (Example) | 60 | 1.5 | present | none | 35.1 | 75.1 | 15.82 |
| C | (Comparative Example) | 100 | 1.5 | absent | none | 33.8 | 76.2 | 15.20 |

Breakage at the connection between bus bar electrode and finger electrode was observed under standard level A, but not in the method of the invention and also under level C using a large opening width.

The short-circuit current dropped under level C using a large finger electrode width. This drop is caused by a shadow loss due to the increased width. The fill factor under level B free of breakage was 75.1%, which was about 1.5% higher than that under level A undergoing breakage.

In the prior art, breakage at the connection between bus bar electrode and finger electrode occurred. Using the screen printing plate of the invention, electrodes having a high aspect ratio can be formed at no risk of breakage without increasing the number of steps.

As demonstrated above, the invention ensures that bus bar electrode and finger electrode are formed at no risk of breakage at the connection between bus bar electrode and finger electrode. Thus solar cells having a high conversion efficiency can be manufactured in high yields.

REFERENCE SIGNS LIST 1 screen printing plate
2 finger electrode opening
3 bus bar electrode opening
4 blocked zone in bus bar electrode opening
5 blocked zone
12 finger electrode
13 front bus bar electrode
100 p-type semiconductor substrate
101 n-type diffusion layer
102 antireflection film (SiNx film)
103 BSF layer
104 aluminum electrode
105 front bus bar electrode
106 back bus bar electrode
107 finger electrode
110 mesh fabric
111 emulsion
112 squeegee
113 dent
114 breakage

The invention claimed is:

1. A screen printing plate for use in printing a conductive paste to simultaneously form a bus bar electrode and a plurality of finger electrodes on a solar cell, wherein the screen printing plate includes a bus bar electrode opening and a plurality of finger electrode openings, wherein the finger electrode openings have an opening width of less than 80 μm, and the screen printing plate has a plurality of blocked zones in the bus bar electrode opening, formed only at positions aligned with the finger electrode openings.

2. The screen printing plate of claim 1, wherein a total area of the blocked zones accounts for 30% to 60% of a bus bar electrode opening area computed from a contour of the bus bar electrode opening of the screen printing plate.

3. The screen printing plate of claim 1, wherein the blocked zones are aligned with a longitudinal direction of the finger electrode openings.

4. The screen printing plate of claim 2, wherein a spacing between blocked zones is 100 to 2,000 μm.

5. The screen printing plate of claim 2, wherein the width of the bus bar electrode opening is 0.5 to 3 mm.

6. The screen printing plate of claim 1, wherein a blocked zone in the bus bar electrode opening is spaced apart a distance of 50 to 700 gm from a boundary between the finger electrode openings and the bus bar electrode opening.

7. A method of printing solar cell electrodes, in which a conductive paste is printed to simultaneously form a bus bar electrode and a plurality of finger electrodes on a solar cell, by using the screen printing plate of claim 1 and moving a squeegee in a direction perpendicular to a longitudinal direction of the bus bar electrode.

8. The screen printing plate of claim 1, wherein the blocked zones are aligned with a longitudinal direction of the finger electrode openings.

9. The screen printing plate of claim 1, wherein a spacing between blocked zones is 100 to 2,000 μm.

10. The screen printing plate of claim 1, wherein the width of the bus bar electrode opening is 0.5 to 3 mm.

* * * * *